(12) United States Patent
Schwiebert et al.

(10) Patent No.: US 6,239,385 B1
(45) Date of Patent: May 29, 2001

(54) SURFACE MOUNTABLE COAXIAL SOLDER INTERCONNECT AND METHOD

(75) Inventors: Matthew K. Schwiebert; Ron Barnett, both of Santa Rosa; Geary L. Chew, Foster City; Gerald J. Gleason, Los Altos; Dean B. Nicholson, Windsor, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/031,864

(22) Filed: Feb. 27, 1998

(51) Int. Cl.[7] .............................. H01R 12/04; H05K 1/11
(52) U.S. Cl. .............................................. 174/261; 439/63
(58) Field of Search ..................................... 174/260, 261; 361/772, 773, 774, 803; 439/63, 65

(56) References Cited

U.S. PATENT DOCUMENTS

| 4,498,122 | * | 2/1985 | Rainal ................................... 361/414 |
| 4,941,831 |  | 7/1990 | Tengler et al. .......................... 439/63 |
| 5,011,066 | * | 4/1991 | Thompson ........................ 228/180.2 |

(List continued on next page.)

OTHER PUBLICATIONS

"Surface–Mount Coaxial Connectors" Microwave Journal, Jul. 1997, p. 166.

*Microelectronics Packaging Handbook* Part 1, No. 7, Rao R. Tummala et al. "Microelectronics Packaging—An Overview". 1997, II–3–5.

*Electronic Packaging and Interconnection Handbook,* Charles A. Harper, "Electronic Packaging Defined", 1997, p. xi.

*Soldering Handbook for Printed Circuits and Surface Mounting,* Howard H. Manko, Chapter 5, Surface–Mounted Soldering Technology, pp. 169–173.

*Modern Solder Technology for Competitive Electronics Manufacturing,* Jennie S. Hwang, Chapter I, "Introduction", pp.1–7.

(List continued on next page.)

*Primary Examiner*—Jeffrey Gaffin
*Assistant Examiner*—Jeremy Morris
(74) *Attorney, Agent, or Firm*—Marc R. Mayer (57) ABSTRACT

A surface mountable coaxial solder interconnect. The invention provides a small, low-cost, passively self-aligning, high-frequency electronic interconnect adapted to mass production and method. The invention includes a substrate, a signal conductor, and an annular conductor. The substrate incorporates an annular pad and a signal pad substantially centered within the annular pad. The signal conductor includes reflowed solder and is wetted to the signal pad. Similarly, the annular conductor includes reflowed solder and is wetted to the annular pad. The invention may also provide a second substrate substantially parallel to the first substrate that includes a second annular pad and a second signal pad substantially centered within the second annular pad. In such a case, the signal conductor is also wetted to the second signal pad, and, similarly, the annular conductor is also wetted to the second annular pad. The method of the invention includes obtaining a mask and a substrate. The mask obtained defines a center cavity and an annular cavity surrounding the center cavity, and may also define an outer cavity in fluidic communication with the annular cavity. The substrate obtained includes a solder-wettable signal pad, and a solder-wettable annular pad surrounding the signal pad. The mask is then filled with solder paste and aligned with the substrate such that the center cavity of the mask is in registry with the signal pad. The solder paste is then reflowed, generating solder wetting the solder-wettable signal pad and the solder-wettable annular pad.

17 Claims, 8 Drawing Sheets

U.S. PATENT DOCUMENTS

| | | | |
|---|---|---|---|
| 5,024,372 | 6/1991 | Altman et al. | 228/248 |
| 5,347,086 | 9/1994 | Potter et al. | 174/261 |
| 5,401,912 | 3/1995 | Mattei | 174/263 |
| 5,466,160 | 11/1995 | Ogura | 439/63 |
| 5,482,477 | 1/1996 | Michael | 439/581 |
| 5,522,132 | 6/1996 | Mattei | 29/846 |
| 5,539,153 | 7/1996 | Schwiebert et al. | 174/260 |
| 5,545,465 | 8/1996 | Gaynes et al. | 428/209 |
| 5,578,874 | 11/1996 | Kurogi et al. | 257/778 |
| 5,586,715 | 12/1996 | Schwiebert et al. | 228/248.1 |
| 5,607,099 | 3/1997 | Yeh et al. | 228/180.22 |
| 5,643,831 | 7/1997 | Ochiai et al. | 437/183 |
| 5,658,827 | 8/1997 | Aulicino et al. | 228/180.22 |
| 5,662,480 | 9/1997 | Togashi | 439/63 |
| 5,662,489 | 9/1997 | Stirling | 439/322 |
| 5,672,542 | 9/1997 | Schwiebert et al. | 437/183 |
| 5,898,574 * | 4/1999 | Tan et al. | 361/777 |

OTHER PUBLICATIONS

John A. DeVore, "Soldering and Mounting Technology", General Electric Company, Section 6, Introduction.

*Soldering in Electronics*, R. J. Klen Wassink, Chapter 1, "Soldering in Electronics", 1989, pp. 1 and 2, 10–13.

*Microwave Engineering*, David M. Pozar, Chapter 1, "Introduction", 1190, pp. 1–2.

John H. Bryant, "Coaxial Transmission Lines, Related Two–Conductor Transmission Lines, Connectors, and Components: A U.S. Historical Perspective", IEEE Transactions on Microwave Theory and Techniques, vol. MTT–32, No. 9 Sep. 1984, pp. 970–983.

Ichiro Yamaguchi et al., "Solder Bump Transcription Technology Using A Dimple–Plate Method", 1998, pp. 351–354.

Raj N. Master et al., "Ceramic Mini–Ball Grid Array Package for High Speed Device", Proceedings $45^{th}$. Electronic Components & Technology Conference, May 21–24, 1995, pp. 46–50.

* cited by examiner

SURFACE MOUNTABLE COAXIAL SOLDER INTERCONNECT AND METHOD

BACKGROUND OF THE INVENTION

1. Field of the Invention

This invention generally relates to electronic packaging and assembly. More particularly, this invention relates to electronic interconnect technology, specifically for high-frequency and microwave applications.

2. Description of the Related Art

As the operating frequencies of electronic circuits move into the gigahertz range and beyond, the shapes of electronic interconnects become critical to their function. At relatively low frequencies (a "low" frequency is a frequency at which the wavelength of the signal is much longer than the dimensions of the interconnects), simple conductive paths are sufficient and the shapes of those paths have no significant electrical effect. Examples of simple conductive interconnects include: pin-through-hole, wirebonding, tape automated bonding (TAB), leaded surface mount, ball grid array, and flip-chip interconnects.

But at relatively high frequencies, the wavelength is of the same order as, or shorter than, the dimensions of the interconnects. Simple conductive paths are no longer adequate because of electromagnetic losses and reflections that result from characteristic impedance mismatches between components. This true for both first level (integrated circuit (IC) to package) connections as well as second level (electronic component package to substrate) connections.

One method of connecting components to substrates has been to use surface mount solder interconnects. In general, this process involves placing the electrical contact of an electronic component or substrate, a small amount of solder or solder paste, and a solder wettable pad on a printed circuit board in close proximity. They are then heated until the solder reflows, forming an electrical connection between the solder wettable pad and the electrical contact of the electronic component. Once the solder has cooled, it forms both an electrical and a mechanical connection between the electronic component and the printed circuit board. This process has numerous advantages over other methods of interconnection. First, a large number of components can be interconnected simultaneously. Second, the process is highly repeatable and relatively low cost and is easily adapted for mass production. These interconnections, however, are not generally suited to high-frequency circuits because of electromagnetic leakage and unwanted signal reflections caused by impedance mismatches.

It is known in the art that the high-frequency electrical performance of these interconnects may be improved by surrounding signal interconnects with ground interconnects. For example, a ball grid array signal ball may be surrounded on all sides with ground balls. While this approach improves high-frequency electrical performance, there is still be a considerable amount of electromagnetic leakage between the ground balls. In addition, the characteristic impedance of the interconnect is generally not controlled, potentially causing unwanted signal reflections. The magnitude of both electromagnetic leakage and unwanted signal reflections increase as the operating frequency increases.

In high-frequency applications such as microwave technology in which the electromagnetic leakage and signal reflections must be tightly controlled, interconnects have been made with individually machined coaxial connectors, glass feeds, and semi-rigid coaxial cable. See, for example, U.S. Pat. No. 5,618,205 (Wideband solderless right-angle RF interconnect); U.S. Pat. No. 5,580,276 (Coaxial plug connector component for connection to printed circuit board); U.S. Pat. No. 4,964,805 (Microcoaxial connector having bipartite outer shell); U.S. Pat. No. 4,631,505 (Right angle microwave stripline circuit connector); U.S. Pat. No. 4,577,923 (Microwave integrated circuit and mounting device therefor); and U.S. Pat. No. 4,466,160 (Surface mount type receptacle of coaxial connector and mounting arrangement for mounting receptacle of coaxial connector on substrate). While these types of interconnects have excellent high-frequency electrical characteristics, they consist of many precision made small parts. As a result, they are both expensive to manufacture and not well suited for mass production. Additionally, their relatively large size often prohibits using these interconnects in applications where space is limited.

A first level coaxial interconnect deposited by electroplating and connected through a welding process is also known. See, for example, U.S. Pat. No. 5,347,086 (Coaxial die and substrate bumps). While this type of interconnect has good high-frequency electrical characteristics, it does not meet the need for a low-cost, passively self-aligning electronic interconnect that is easily mass produced.

Accordingly, it is apparent that there is a need for a small, low-cost, passively self-aligning, electronic interconnect that can be mass-produced and assembled with the ease of surface mount solder interconnects while providing the high-frequency electrical performance of individually machined coaxial connectors.

SUMMARY OF THE INVENTION

Generally the invention provides a small, low-cost, passively self-aligning, electronic interconnect that is readily adaptable to mass production. More specifically, the invention provides a surface-mountable coaxial solder interconnect including a substrate, a signal conductor, and an annular conductor. The substrate incorporates an annular pad and a signal pad substantially centered within the annular pad. The signal conductor and the annular conductor include reflowed solder and are wetted to the signal pad and annular pad, respectively.

The invention may also provide a second substrate substantially parallel to the first substrate that includes a second annular pad and a second signal pad substantially centered within the second annular pad. In such a case, the signal conductor is also wetted to the second signal pad, and, similarly, the annular conductor is also wetted to the second annular pad.

Further, the substrate according to the invention may include a primary shielding layer, a secondary shielding layer, and a signal trace arranged in a stripline configuration. In such a case, the primary shielding layer is electrically connected to the annular pad and the secondary shielding layer is substantially parallel to the primary shielding layer and electrically connected to the primary shielding layer. Additionally, the signal trace is electrically connected to the signal pad and located between and substantially parallel to the primary shielding layer and the secondary shielding layer.

The invention additionally provides a method for forming a surface mountable coaxial interconnect. The method according to the invention includes obtaining a mask and a substrate. The mask obtained should define a center cavity and an annular cavity surrounding the center cavity, and may also define an outer cavity in fluidic communication with the annular cavity. The substrate obtained includes a solder-wettable signal pad, and a solder-wettable annular pad surrounding the signal pad. The mask is filled with solder paste and aligned with the substrate such that the center cavity of the mask is in registry with the signal pad. The solder paste is then reflowed, generating solder features that wet both the signal pad and the annular pad.

The method according to the invention may additionally include obtaining a second substrate. The second substrate includes a second solder-wettable signal pad and a second solder-wettable annular pad surrounding the signal pad. The second substrate is aligned with the first substrate such that the solder is in contact with one of the second signal pad and the second annular pad. The solder features are then reflowed forming an interconnect between the substrates.

While the solder is molten, the second substrate may be allowed to passively self-align and gasses generated by the reflow process are allowed to escape from between the annular pad and the signal pad via a provided path.

Other features and advantages of the present invention will become apparent from the following detailed description, taken in conjunction with the accompanying drawings, illustrating, by way of example, the principles of the invention.

DESCRIPTION OF THE PREFERRED EMBODIMENT

As shown in the drawings for purposes of illustration, the invention provides a surface mountable coaxial solder interconnect and a method for forming surface mountable coaxial interconnects. The invention is based upon a coaxial structure where the center conductor and the annular conductor are both substantially made of reflowable solder.

The invention will provide a low-cost interconnect that controls both electromagnetic leakage and unwanted signal reflections caused by impedance mismatches at high-frequency frequencies. The invention will further provide a method for making the high-frequency interconnect that is readily adaptable to low-cost mass production using readily available surface mount solder reflow technology.

Figure 1:
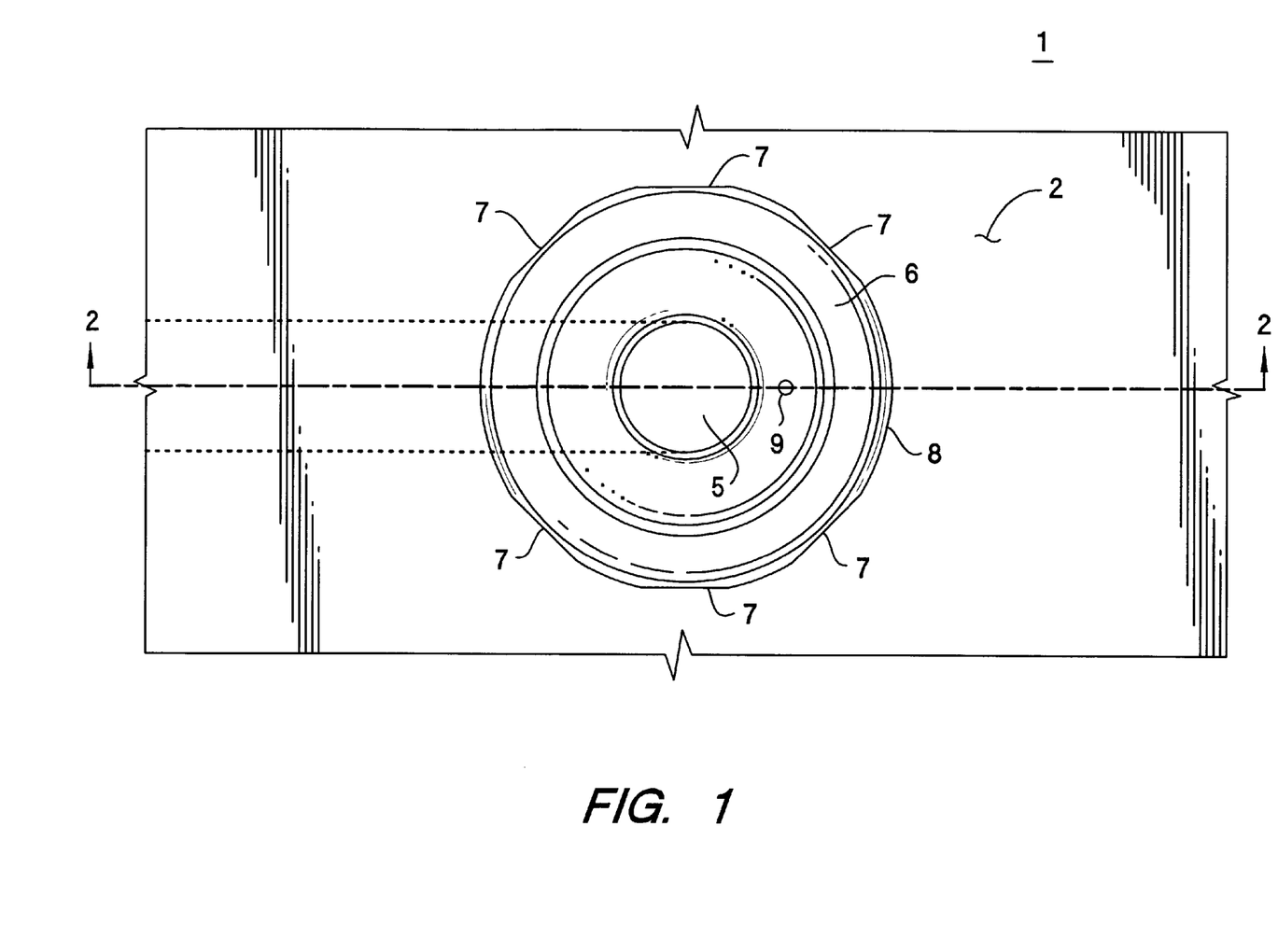
FIG. 1 is a plan view of a first preferred embodiment of the coaxial solder interconnect according to the invention.
Figure 2:
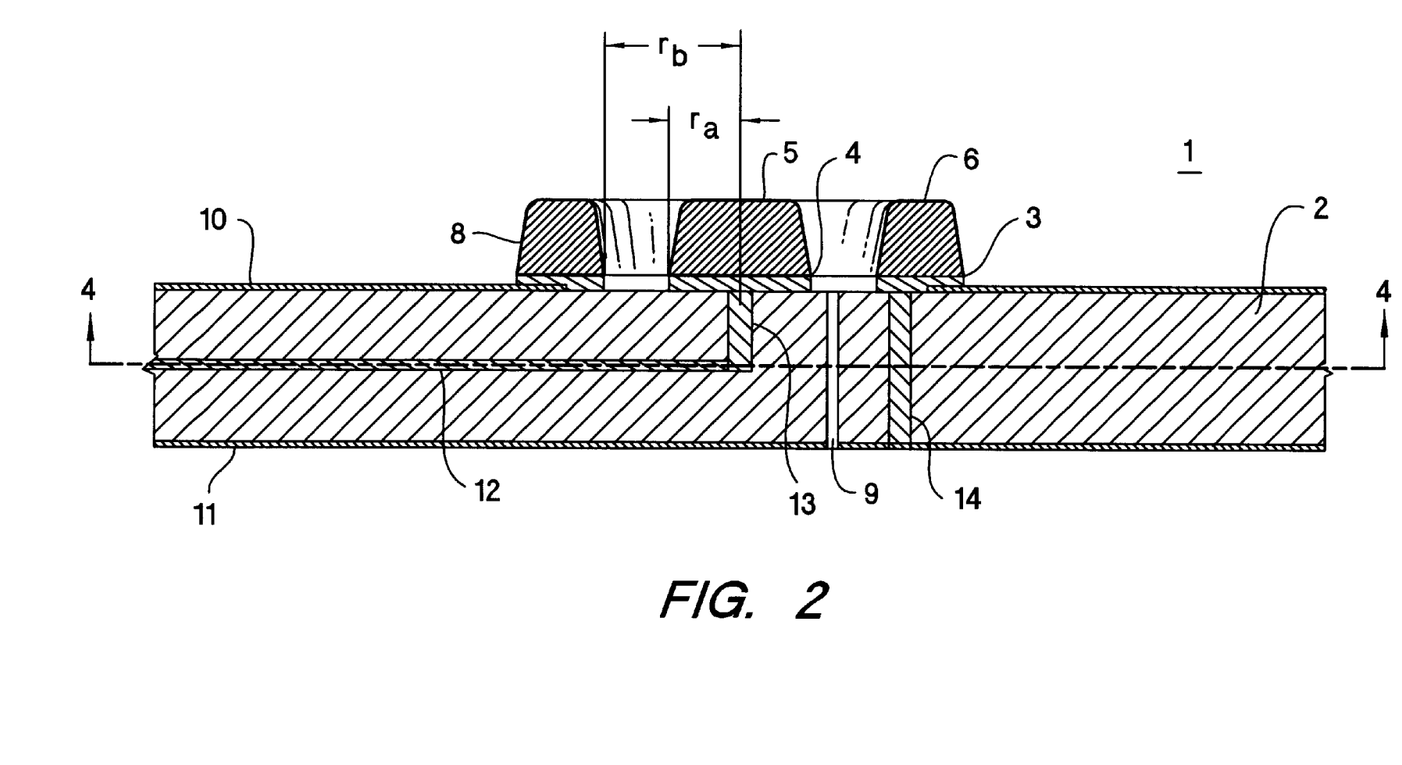
FIG. 2 is a sectional view of the coaxial solder interconnect of FIG. 1 taken along line 2—2.

Referring now to the drawings, it is noted that reference numerals are used to designate identical or similar elements throughout the several views, and that elements are not necessarily shown to scale. Specifically in FIG. 1, FIG. 2, and FIG. 3 a first preferred embodiment of a coaxial surface mount electronic interconnect 1 according to the invention is shown in plan, sectional, and perspective views respectively. The coaxial surface mount interconnect 1 includes a substrate 2. As can be seen in FIG. 2, the substrate has, on one of its surfaces, an annular solder-wettable pad 3, and a solder-wettable signal pad 4 substantially centered within the annular pad 3.

For purposes of this description, the term substrate may include an integrated circuit die, an integrated circuit package, an integrated circuit sub-assembly, a printed-circuit-board, or any device or structure which may be electrically interconnected to another.

Figure 3:
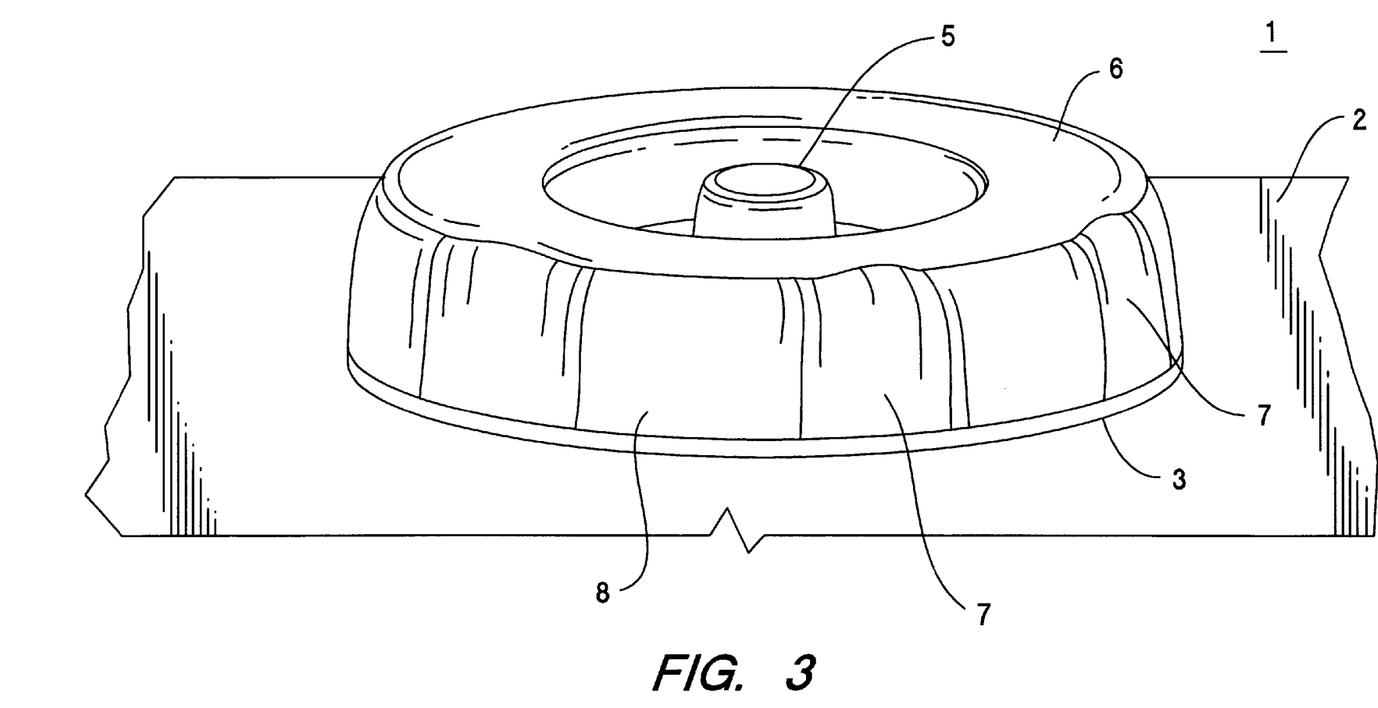
FIG. 3 is a perspective view of the coaxial solder interconnect of FIG. 1.

The first preferred embodiment of the invention additionally includes a signal conductor 5 and an annular conductor 6. Both the signal conductor and annular conductor are made substantially from reflowed solder. The signal conductor 5 is wetted to the solder-wettable signal pad 4, and the annular conductor 6 is wetted to the annular solder-wettable pad 3. For purposes of this description, the term "wetted" includes not only the process by which molten solder adheres to solder-wettable materials, but also the resulting connection between the solder-wettable material and the solder once the solder has solidified. In this embodiment, the annular conductor 6 also preferably includes a number of facets 7 in the outward facing surface 8 of the annular conductor. The annular conductor reduces both electromagnetic leakage from and unwanted signal reflections within the coaxial interconnect 1 during high-frequency operation.

Those skilled in the art should appreciate that the dimensions of the signal conductor 5 and the annular conductor 6 can also be manipulated to control the impedance through the coaxial surface mount interconnect 1. The standard impedance for coaxial lines is:

$$Z_0 = \frac{1}{2\pi} \sqrt{\frac{\mu}{\epsilon}} \cdot \ln\left(\frac{r_b}{r_a}\right)$$

where $Z_0$ is the characteristic impedance, $\mu$ is the permeability of the dielectric, $\epsilon$ is the permittivity of the dielectric, $r_a$ is the outer radius of the signal conductor 5 and $r_b$ is the inner radius of the annular conductor 6. Using the standard impedance formula, and substituting for $\mu$ and $\epsilon$ the permeability and permittivity constants for air, the impedance of the coaxial surface mount interconnect 1 of the present invention can be calculated to be:

$$Z_0 \approx 60 \cdot \ln\left(\frac{r_b}{r_a}\right).$$

Thus, in order to achieve the standard impedance of 50 ohms desired in many high-frequency applications, $r_b \approx 2.3\, r_a$. Of course, this value may change if a dielectric other than air is used, or if a different characteristic impedance is required.

The substrate 2 also preferably includes a vent hole 9 that passes completely through the substrate having an opening between the signal pad 4 and the annular pad 3. As will be described later in detail, the vent hole provides an escape path for the gasses produced when the reflowed solder comprising the signal conductor 5 and the annular conductor 6 melts.

As seen most clearly in FIG. 2, the coaxial solder interconnect according to the invention includes additional features that improve the high-frequency operating characteristics. One of these features is a primary shielding layer 10 affixed to the substrate 2 and electrically connected to the annular pad 3. While it is preferable that the primary shielding layer 10 be affixed to a surface of the substrate 2, as depicted, it is understood that primary shielding layer may also be a buried layer within a composite substrate.

Another of these features is a secondary shielding layer 11 that is also affixed to the substrate 2 such that it is substantially parallel to the primary shielding layer 10 and electrically connected to the primary shielding layer. While it is preferable that the secondary shielding layer 11 be affixed to a surface ofthe substrate 2 opposite the primary shielding layer 10, as depicted, it is understood that the secondary shielding layer may also be a buried layer within a composite substrate.

A third feature is a signal trace 12. The signal trace is preferably embedded within the substrate 2 between and substantially parallel to the primary shielding layer 10 and the secondary shielding layer 11. Thus, the primary shielding layer, the signal trace, and the secondary shielding layer together form a sandwich with the primary shielding layer and secondary shielding layer kept a fixed distance from the signal trace by portions of the substrate. The signal trace is electrically connected to the signal pad by an electrical connection 13. The primary shielding layer, secondary shielding layer, and signal trace together operate as a stripline transmission line, further reducing overall electromagnetic leakage and unwanted signal reflections within the interconnect 1.

Another feature of the coaxial surface mountable interconnect according to the invention is an electrical connection shield 14. The electrical connection shield is contained within the substrate 2 and is electrically connected to the annular pad 3 and the secondary shielding layer 11. The electrical connection shield operates to reduce both electromagnetic leakage from and unwanted signal reflections within the electrical connection 13 during high-frequency operation.

Figure 4:
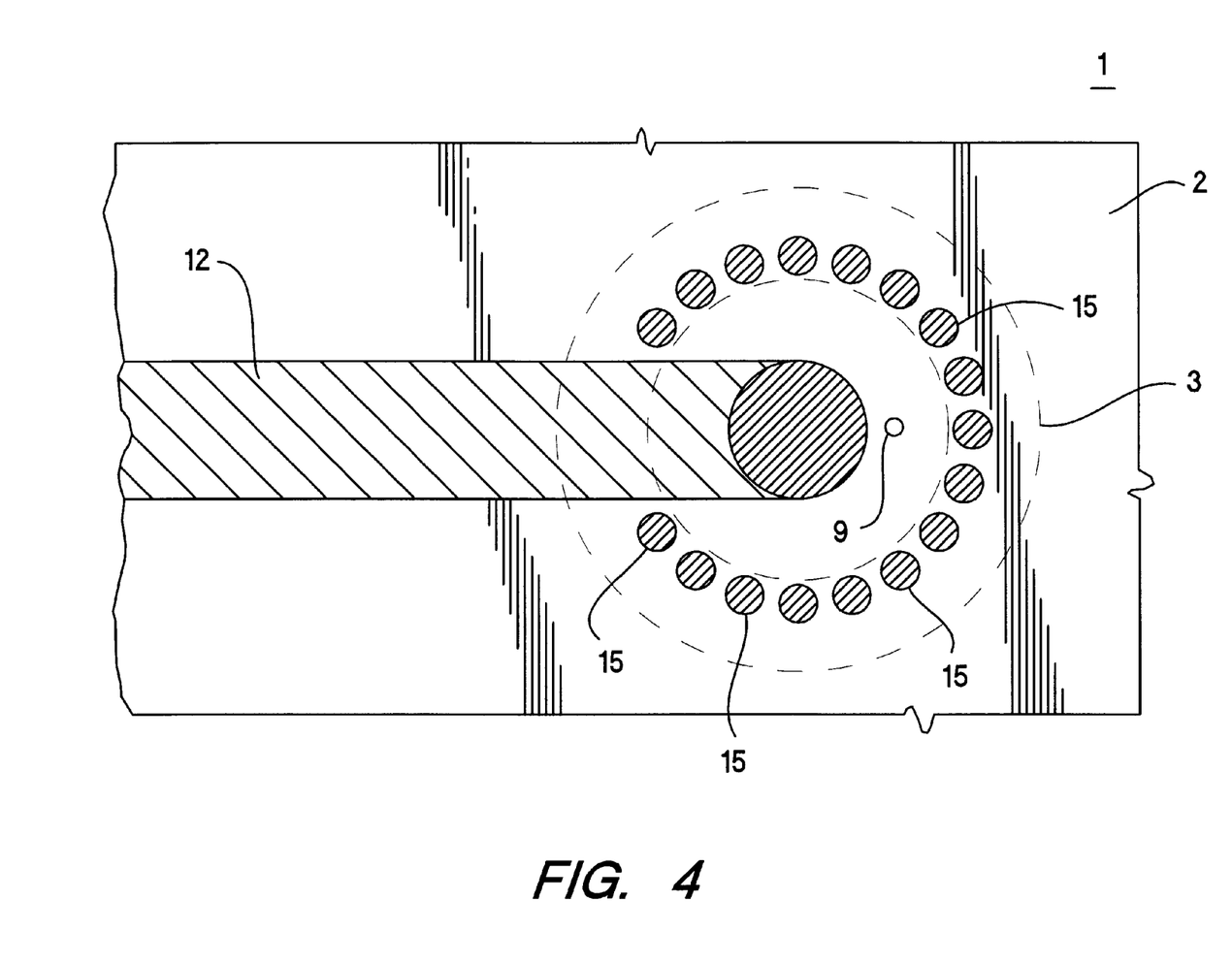
FIG. 4 is a sectional view of the coaxial solder interconnect of FIG. 2 taken along line 4—4 depicting a multiple via construction.
Figure 5:
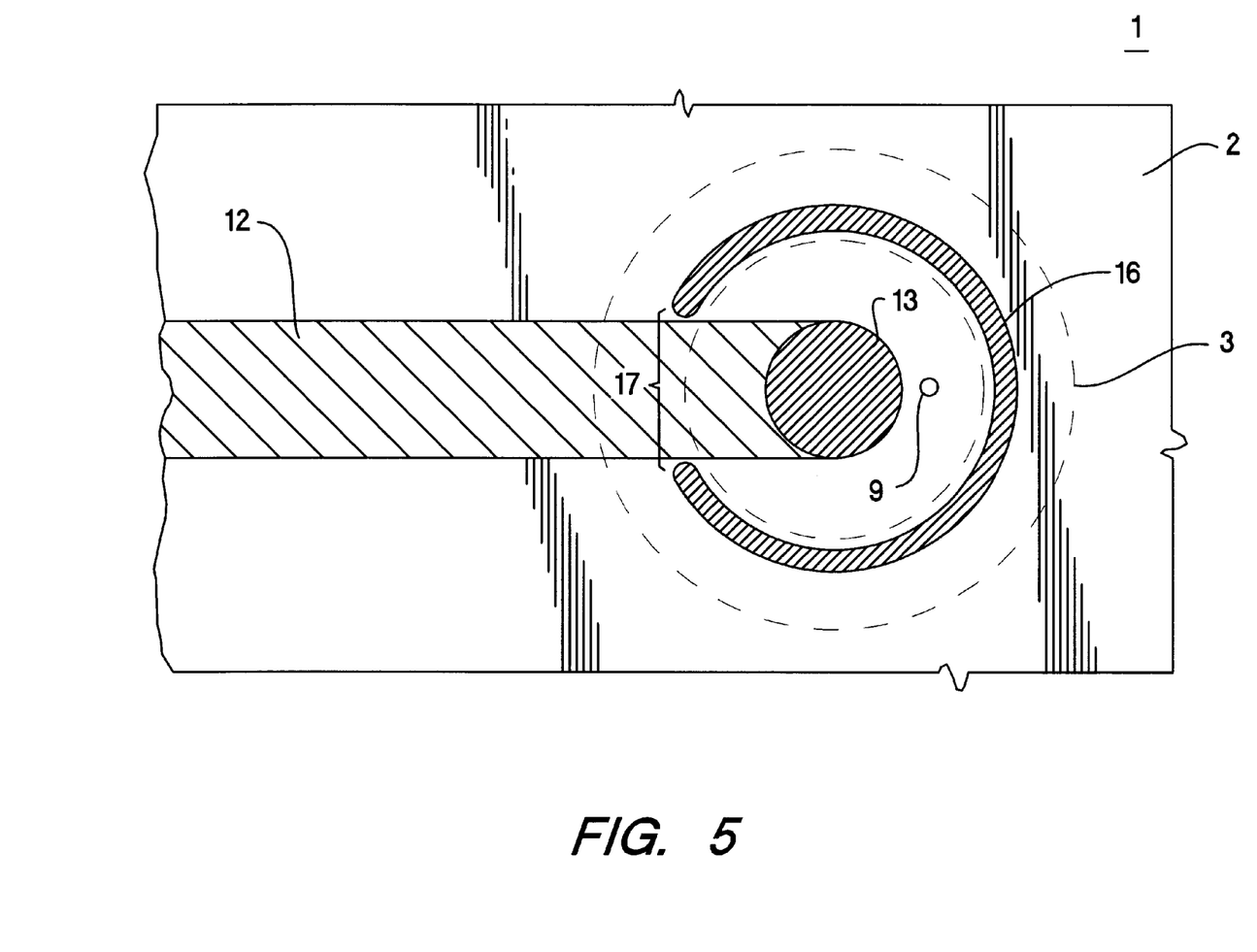
FIG. 5 is sectional view of the coaxial solder interconnect from the same perspective as FIG. 4 depicting a cylindrical shield construction.

Two alternate forms of the electrical connection shield 14 are depicted in FIG. 4 and FIG. 5 respectively. In FIG. 4, the electrical connection shield 14 is embodied by a plurality of vias 15 where each via 15 originates at the annular pad 3 and projects into the substrate 2. In FIG. 5, the electrical connection shield 14 is embodied by a cylindrical shield 16. The cylindrical shield may be semi-circular or horseshoe shaped and is electrically connected to the annular pad 3. They cylindrical shield projects into the substrate 2 from the annular pad. The cylindrical shield 16 also defines an opening 17 through which the signal trace passes.

Figure 6:
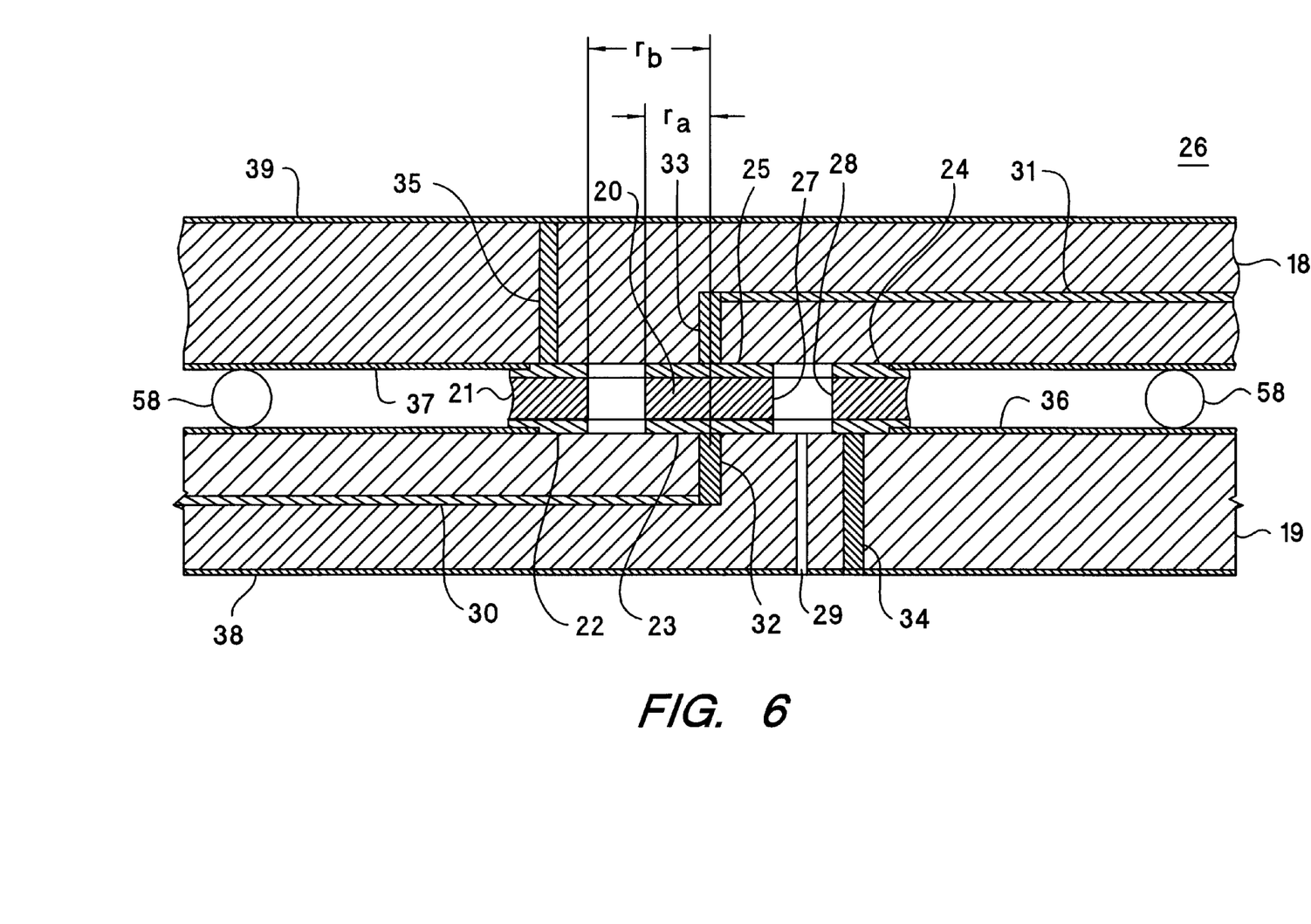
FIG. 6 is a sectional view of a second preferred embodiment of the coaxial solder interconnect according to the invention from the same perspective as FIG. 2.

A second preferred embodiment of the coaxial surface mount interconnect 26 according to the invention is depicted in FIG. 6. The structure of this embodiment is similar to the first preferred embodiment, but includes an interconnected second substrate 18. More precisely, the second embodiment includes a first substrate 19, a signal conductor 20, an annular conductor 21, and the second substrate 18. For clarity, the first substrate 19, signal conductor 20, and annular conductor 21 correspond to the substrate 2, signal conductor 5 and annular conductor 6 of the first embodiment, respectively.

The first substrate 19 includes on one of its surfaces a first solder-wettable annular pad 22 and a first solder-wettable signal pad 23 substantially centered within the first annular pad 22. Similarly, the second substrate 18 includes on one of its surfaces a second solder-wettable annular pad 24 and a second solder-wettable signal pad 25 substantially centered within the second annular pad 24. The second substrate 18 is oriented substantially parallel to the first substrate 19 with the surface of the first substrate including the first annular pad 22 and the first signal pad 23 facing the surface of the second substrate including the second annular pad 24 and the second signal pad 25.

The signal conductor 20 consists primarily of reflowed solder and is wetted to both the first signal pad 23 and the second signal pad 25. The signal conductor electrically connects the first signal pad 23 and the second signal pad 25. The outer wall 27 of the signal conductor is preferably substantially perpendicular to the first signal pad and the second signal pad forming a cylinder. Similarly, the annular conductor 21 consists primarily of reflowed solder and is wetted to both the first annular pad 22 and the second annular pad 24. The annular conductor electrically connects the first annular pad 22 and the second annular pad 24. The annular conductor also preferably has an inner wall 28 that is substantially perpendicular to both the first and second annular pads, having a substantially cylindrical shape. The annular conductor reduces both electromagnetic leakage from and unwanted signal reflections within the signal conductor 20 during high-frequency frequency operation. The dimensions of the signal conductor 20 and the annular conductor 21 can also be manipulated to control the impedance of the coaxial surface mount interconnect 26, as discussed above. It should be noted, however, that the annular conductor 21 of the second preferred embodiment typically does not have the facets 7 found in the annular conductor 6 of the first preferred embodiment 1. The reason for this will be described in detail, below.

A portion of the first substrate 19 located between the first signal pad 23 and the first annular pad 22 may define a vent hole 29 passing through the first substrate. The vent hole 29 corresponds to the vent hole 9 of the first preferred embodiment, discussed above. Additionally, the first substrate 19, the second substrate 18, or both may include many of the features described above as included in the substrate 2 of the first preferred embodiment. For example, signal traces 30, 31 corresponding to signal trace 12 may be included in the first and second substrates, respectively. The same can be said for connections 32, 33 corresponding to electrical connection 13, electrical connection shields 34, 35 corresponding to electrical connection shield 14, primary shielding layers 36, 37 corresponding to primary shielding layer 10, and secondary shielding layers 38, 39 corresponding to secondary shielding layer 11.

Figure 7:
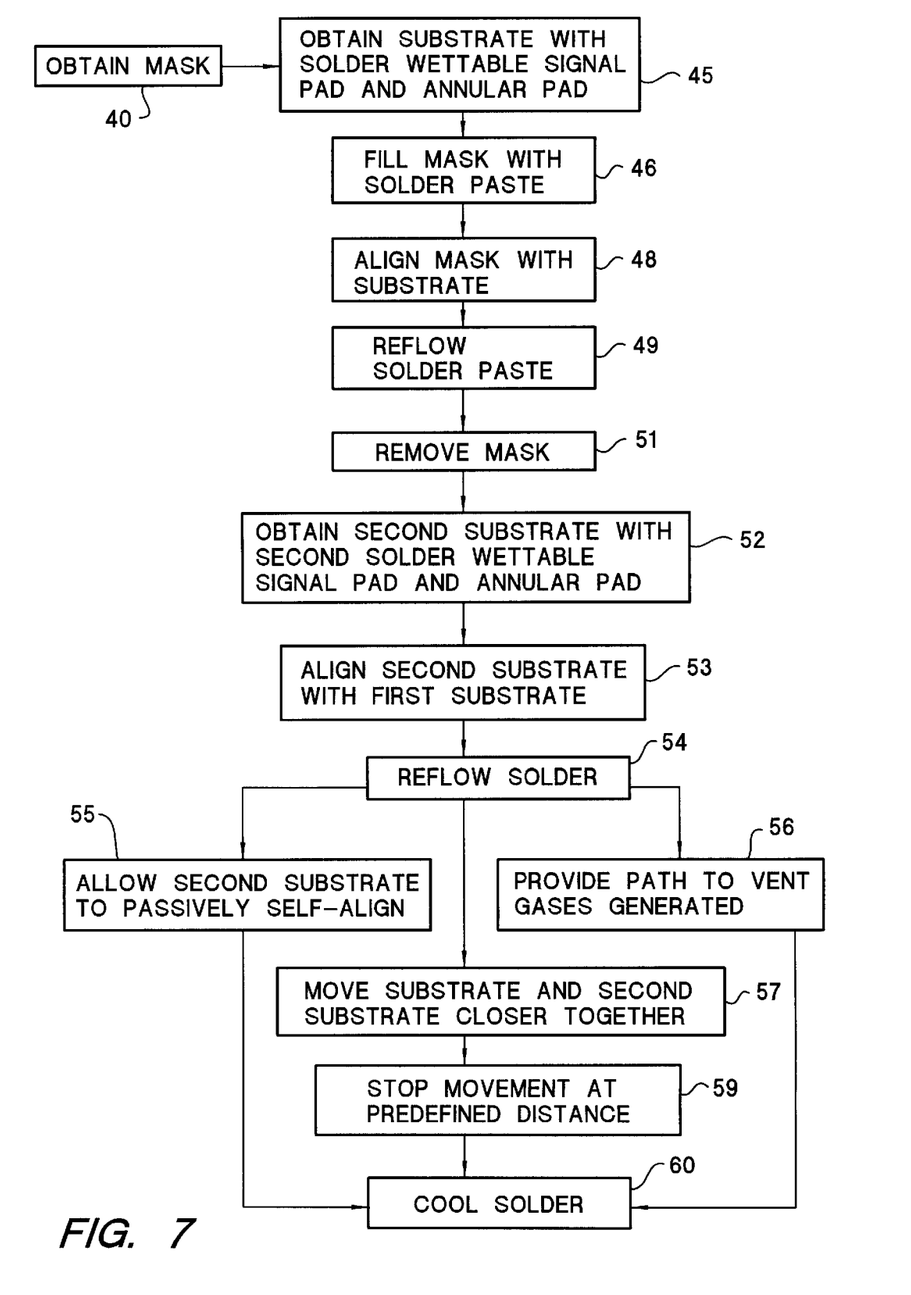
FIG. 7 is a block diagram of a method of forming coaxial solder interconnects according to the invention.

The invention further includes a method for manufacturing the coaxial solder interconnect 1, 26 according to the invention. A block diagram of this method is depicted in FIG. 7. The first step of this method is to obtain a mask (block 40). An example of the mask 41 to be obtained is depicted in plan view and sectional view in FIG. 8 and FIG. 9, respectively. The mask should define a center cavity 42 and an annular cavity 43 surrounding the center cavity.

Figure 8:
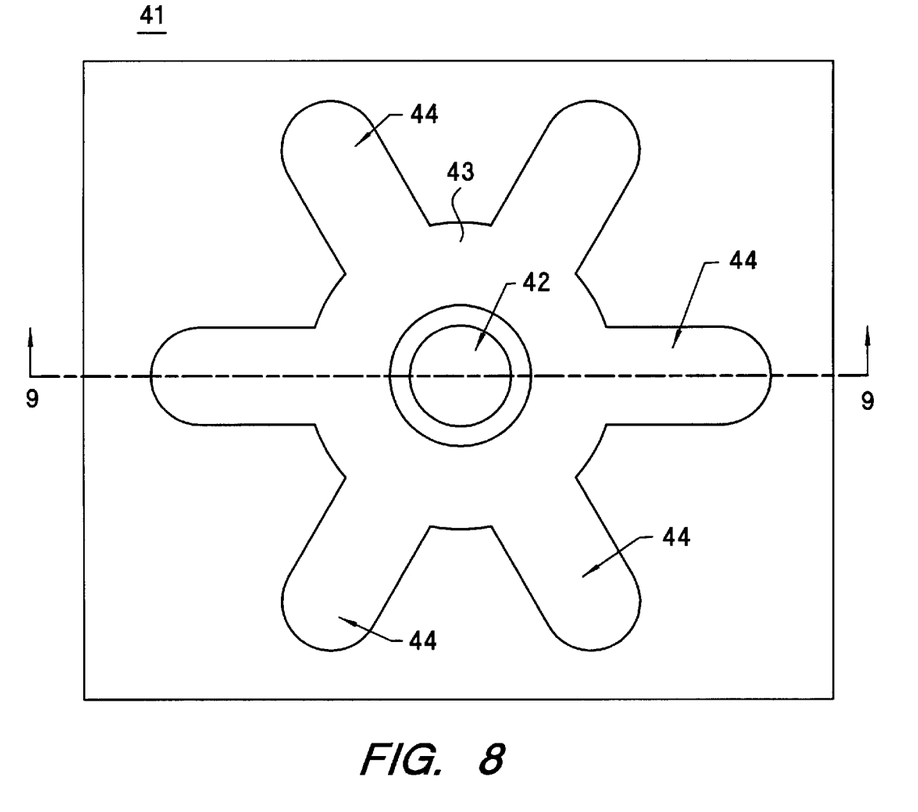
FIG. 8 is a plan view of a mask used to form the coaxial solder interconnect.
Figure 9:
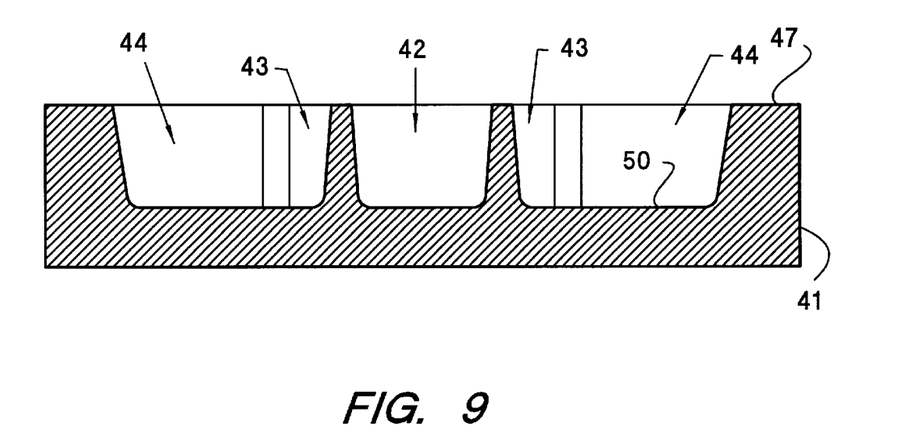
FIG. 9 is a sectional view of the mask shown in FIG. 8 taken along line 9—9.

The mask may be made of a non solder-wettable material such as aluminum, silicon, or other material that can be etched or machined in order to form the appropriate cavities. The mask may be of a type wherein the mask defines the bottom of the cavities as shown in FIG. 8 and FIG. 9, or of a type where the cavities are defined completely through the mask (not shown).

The mask 41 may further define at least one outer cavity 44 in fluidic communication with the annular cavity 43. While six outer cavities 44 are depicted in FIG. 8 for clarity, the preferred embodiment of the mask includes a total of twelve outer cavities 44.

Next, a substrate should be obtained (block 45). The substrate 2 should be of the type shown in FIG. 2 and should include a solder-wettable signal pad 4 and a solder-wettable annular pad 3 surrounding the signal pad. The signal pad and annular pad should be arranged such that the outer radius $r_a$ of the signal pad and the inner radius $r_b$ of the annular pad are such that a desired impedance will be achieved according to the impedance formulas discussed above.

The mask 41 should then be filled with a solder paste (block 46). For purposes of this description, solder paste may include any substance containing solder that can be made to conform to the shape of a cavity at room temperature. Typically, solder paste includes a conglomeration of small solder spheres held together with a binding agent that includes a solder flux. The solder paste (not shown) is placed in the cavities 42, 43, 44 of the mask 41 and a squeegee (not shown) is used to ensure both that the cavities are filled and that no excess solder paste extends above the top surface 47 of the mask.

Next, the mask 41 is aligned with the substrate (block 48) such that the center cavity 42 is in registry with the signal pad 4. If the mask is properly designed, this will also ensure that the annular cavity 43 is in registry with the annular pad 3.

Then, the solder paste is reflowed (block 49). This means that the solder paste is heated beyond the point where the solder within the paste becomes molten. The molten solder coalesces onto the solder-wettable surfaces that it contacts. In this case, the molten solder within the center cavity 42 will coalesce onto the signal pad 4 and the molten solder within the annular cavity 43 will coalesce onto the annular pad 3. In addition, the cohesive nature of the molten solder acts to draw the molten solder from the outer cavities 44 into the annular cavity 43 where it also coalesces onto the annular pad.

Typically, the molten solder will occupy approximately one-half of the volume originally occupied by the solder paste. It is desirable that the annular cavity 43 be nearly completely full of molten solder during the reflow step such that the mask cavity surface 50 rather than surface tension of the molten solder establishes the shape of the solder within the annular cavity. To accomplish this, the outer cavities 44 should be sized such that the total volume of the outer cavities 44 is approximately equal to the volume of the annular cavity 43.

Once the solder paste has become molten and has coalesced, it is cooled, solidifying the solder. The resulting solid solder forms solder features that will typically occupy about one-half the volume of the original solder paste. The solder paste that had filled center cavity 42 will now form the signal conductor 5 wetted to the signal pad. Similarly, the solder paste that had filled the annular cavity 43 and the outer cavities 44, now forms the annular conductor 6 wetted to the annular pad. The annular conductor will include facets 7 shown in FIG. 1 and FIG. 3 and described above. A facet 7 forms in the outer surface 8 of the annular conductor 6 at each juncture between the annular cavity 43 and the outer cavities 44 where there is no mask material to control the shape of the outward facing surface 8 of the annular conductor.

Next, the mask 41 may be removed from the substrate (block 51) and the now solidified solder. This will result in the coaxial surface mount interconnect 1 configuration shown in FIG. 1, FIG. 2, and FIG. 3. While it is preferred that the mask be removed, it is understood that it is possible to leave the mask in place with certain mask configurations such as mask types where the cavities are defined completely through the mask.

Once the mask has been removed from the substrate (block 51), flux residue (not shown) left over from the reflow process (block 49) can be cleaned away from the substrate using water or other methods known in the art.

A second substrate is then obtained (block 52). An example of a second substrate is shown in FIG. 6. The second substrate 18 should have a configuration similar to that of the substrate 2 described above, which will now be called the first substrate 19 for clarity, and should include a second solder-wettable signal pad 25 and a second solder-wettable annular pad 24 surrounding the signal pad.

The second substrate 18 should then be aligned with the first substrate 19 (block 53) such that the second signal pad 25 is in registry with the signal conductor 20 and second the annular pad 24 is in registry with the annular conductor 21. Precise alignment is not required for this step, but at least some portion of the signal conductor or the annular conductor should contact the second signal pad or the second annular pad, respectively.

The solder that forms the signal conductor 20 and the annular conductor 21, collectively described as solder features, is then reflowed (block 54). The molten solder of the signal conductor 20 will wet the second signal pad 25 and the molten solder of the annular conductor 21 will wet the second annular pad 24. It should also be noted that this reflow step eliminates the facets 7 described above. Applying a small amount of no-clean solder flux or solder paste (not shown) to the second signal pad 25, the second annular pad 24, and the solder that forms the signal conductor 20 and the annular conductor 21, or some combination thereof assures proper wetting of the second signal pad and the second annular pad by the molten solder.

While the solder is molten, the second substrate 18 is allowed to move freely relative to the first substrate 19. The surface tension of the molten solder places a force on the first substrate 19 and the second substrate 18 that tends to move the second substrate relative to the first substrate. The surface tension of the molten solder of the signal conductor 20 will tend to move the second substrate in a direction relative to the first substrate that places the second signal pad 25 directly over the first signal pad 23. Similarly, the surface tension of the molten solder of the annular conductor 21 will tend to move the second substrate in a direction relative to the first substrate that places the second annular pad 24 directly over the first annular pad 22. This process is called passive self-alignment (block 55).

Preferably, the first and second signal pads 23, 25 are the same size and the first and second annular pads 22, 24 are the same size. If this is the case, then movement of the second substrate 18 relative the first substrate 19 will stop when the outer wall 27 of the signal conductor 20 is substantially perpendicular to the first signal pad 23 and the second signal pad 25. Similarly movement of the second substrate relative to the first substrate should stop when the inner wall 28 of the annular conductor 21 is substantially perpendicular to both the first and second annular pads.

A volume of gas is typically trapped between the outer wall 27 of the signal conductor 20 and the inner wall 28 of the annular conductor 21 during the reflow process (block 54) described above. The pressure of this trapped gas may be affected by numerous factors including volume changes during passive self-alignment (block 55), temperature changes during reflow, and volatilization of entrapped liquids during reflow. Changes in pressure of this trapped volume of air relative to the outside environment are not desirable. Such changes can deform the shape of the outer wall 27 and force the substrates 18, 19 apart. To eliminate this problem, a path should be provided to vent these gasses to the outside environment (block 56). In the preferred embodiment, this path is provided by the inclusion of a vent hole 29 in either the first or second substrate 18, 19.

Also while the solder is molten, the surface tension of the molten solder of the signal conductor 20 and the annular conductor 21 applies a force that tends to draw the first and second substrates 18, 19 together (block 57). This compresses the molten solder of the signal conductor 20 between the first and second signal pads 23, 25 and compresses the molten solder of the annular conductor 21 between the first and second annular pads 22, 24. This eliminates any gaps that may have formed between the molten solder of the signal conductor and the first and second signal pads and assures good electrical contact with the entire pad surface. Similarly, any gaps that may have formed between the molten annular conductor and the first and second annular pads are eliminated and good electrical contact with the entire surface of the first and second annular pads is assured.

The distance between the first and second substrates 18, 19 after compression (block 57) is preferably controlled by the use of mechanical stops 58 located between the first and second substrate as is known in the art. If no mechanical stops are used, the surface tension of the molten solder of the signal conductor 20 and the annular conductor 21 will tend to move the first and second substrates so close together that the outer wall 27 of the signal conductor and the inner wall 28 of the annular conductor will both tend to take on a convex shape. While the convex shape may be sufficient in some applications, the high-frequency characteristics of the interconnect 26 are optimized when the outer wall remains substantially perpendicular to both the first and second annular pads 22, 24. Using mechanical stops 58 to control the closure between of the first and second substrate to a predefined distance (block 59) ensures optimization of the high-frequency characteristics.

Once the first and second substrate have moved together, the solder may be allowed to cool and solidify (block 60) thus forming the second preferred embodiment of the coaxial surface mount interconnect 26 according to the invention.

Having thus described exemplary embodiments of the invention, it will be apparent that further alterations, modifications, and improvements will also occur to those skilled in the art. Such alterations, modifications, and improvements, though not expressly described or mentioned above, are nonetheless intended and implied to be within the scope of the invention. Accordingly, the foregoing discussion is intended to be illustrative only; the invention is limited and defined only by the various following claims and equivalents thereto.

We claim:

1. A surface mountable coaxial interconnect comprising:
   a substrate, including:
      an annular pad, and
      a signal pad substantially centered within the annular pad,
   a portion of the substrate located between the signal pad and the annular pad defining a vent hole passing through the substrates;
   a signal conductor, including:
      reflowed solder wetted to the signal pad, and
      an outer wall; and
   an annular conductor, including:
      reflowed solder wetted to the annular pad, and
      an inner wall.

2. The surface mountable coaxial interconnect of claim 1, wherein
   the outer wall is substantially perpendicular to the signal pad.

3. The surface mountable coaxial interconnect of claim 1, wherein
   the inner wall is substantially perpendicular to the annular pad.

4. The surface mountable coaxial interconnect of claim 1, wherein:
   the outer wall is substantially perpendicular to the signal pad, and
   the inner wall is substantially perpendicular to the annular pad.

5. The surface mountable coaxial interconnect of claim 1, wherein:
   the inner wall is substantially perpendicular to both the first annular pad and the second annular pad.

6. The surface mountable coaxial interconnect of claim 1, wherein:
   the outer wall is substantially perpendicular to both the first signal pad and the second signal pad, and
   the inner wall is substantially perpendicular to both the first annular pad and the second annular pad.

7. A surface mountable coaxial interconnect comprising:
   a substrate, including:
      an annular pad, and
      a signal pad substantially centered within the annular pad;
   a signal conductor, including:
      reflowed solder wetted to the signal pad, and
      an outer wall; and
   a faceted annular conductor, including:
      reflowed solder wetted to the annular pad, and
      an inner wall.

8. A surface mountable coaxial interconnect comprising:
   a substrate, including:
      an annular pad,
      a signal pad substantially centered within the annular pad,
      a primary shielding layer electrically connected to the annular pad,
      a secondary shielding layer substantially parallel to the primary shielding layer and electrically connected to the primary shielding layer, and
      a signal trace, electrically connected to the signal pad and located between and substantially parallel to the primary shielding layer and the secondary shielding layer;
   a signal conductor, including:
      reflowed solder wetted to the signal pad, and
      an outer wall; and
   an annular conductor, including:
      reflowed solder wetted to the annular pad, and
      an inner wall.

9. The surface mountable coaxial interconnect of claim 8, wherein the substrate further includes:
   an electrical connection between the signal pad and the signal trace; and
   vias projecting into the substrate from the annular pad and electrically connected to the annular pad, the vias shielding the electrical connection.

10. The surface mountable coaxial interconnect of claim 8, wherein the substrate further includes:
   an electrical connection between the signal pad and the signal trace; and
   a cylindrical shield, the cylindrical shield:
      electrically connected to the annular pad,
      projecting into the substrate from the annular pad,
      shielding the electrical connection, and
      defining an opening through which the signal trace passes.

11. A surface mountable coaxial interconnect comprising:
   a first substrate, including:
      a first annular pad, and
      a first signal pad substantially centered within the first annular pad;
   a second substrate substantially parallel to the first substrate and including:
      a second annular pad, and
      a second signal pad substantially centered within the second annular pad;
   a signal conductor, the signal conductor including:
      reflowed solder wetted to the first signal pad and the second signal pad, and
      an outer wall; and
   an annular conductor, the annular conductor including:
      reflowed solder wetted to the first annular pad and the second annular pad, and
      an inner wall.

12. The surface mountable coaxial interconnect of claim 11, wherein a portion of the first substrate located between the first signal pad and the first annular pad defines a vent hole passing through the first substrate.

13. The surface mountable coaxial interconnect of claim 11, additionally comprising:
   a mechanical stop disposed between the first substrate and the second substrate, the mechanical stop dimensioned to allow the inner wall, when molten, to be substantially perpendicular to the annular pad.

14. The surface mountable coaxial interconnect of claim 7, wherein the outer wall is substantially perpendicular to both the first signal pad and the second signal pad.

15. The surface mountable coaxial interconnect of claim 11, wherein the first substrate further includes:
   a primary shielding layer electrically connected to the first annular pad;
   a secondary shielding layer substantially parallel to the primary shielding layer and electrically connected to the primary shielding layer; and
   a signal trace, electrically connected to the first signal pad and located between and substantially parallel to the primary shielding layer and the secondary shielding layer.

16. The surface mountable coaxial interconnect of claim 15, wherein the first substrate further includes:
   an electrical connection between the first signal pad and the signal trace; and
   vias projecting into the first substrate from the first annular pad and electrically connected to the first annular pad, the vias shielding the electrical connection.

17. The surface mountable coaxial interconnect of claim 15, wherein the first substrate further includes:
   an electrical connection between the first signal pad and the signal trace; and
   a cylindrical shield, the cylindrical shield:
      electrically connected to the first annular pad,
      projecting into the first substrate from the first annular pad,
      shielding the electrical connection, and
      defining an opening through which the signal trace passes.

* * * * *